United States Patent
Robbins et al.

(10) Patent No.: US 7,473,941 B2
(45) Date of Patent: Jan. 6, 2009

(54) STRUCTURES FOR REDUCING OPERATING VOLTAGE IN A SEMICONDUCTOR DEVICE

(75) Inventors: Virginia M. Robbins, Los Gatos, CA (US); Steven D. Lester, Palo Alto, CA (US); Jeffrey N. Miller, Los Altos Hills, CA (US); David P. Bour, Cupertino, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 99 days.

(21) Appl. No.: 11/203,917

(22) Filed: Aug. 15, 2005

(65) Prior Publication Data

US 2007/0034853 A1    Feb. 15, 2007

(51) Int. Cl.
*H01L 33/00* (2006.01)

(52) U.S. Cl. .............................. 257/102; 257/104
(58) Field of Classification Search ............... 257/99, 257/102, 104, 106, 607, 609, E33.029
See application file for complete search history.

(56) References Cited

U.S. PATENT DOCUMENTS

| | | | | |
|---|---|---|---|---|
| 4,131,904 A | * | 12/1978 | Ladany et al. | 257/96 |
| 4,223,336 A | * | 9/1980 | Thompson | 257/609 |
| 5,825,052 A | * | 10/1998 | Shakuda | 257/94 |
| 6,686,610 B2 | * | 2/2004 | Sheu | 257/103 |
| 6,878,975 B2 | * | 4/2005 | Hueschen | 257/104 |
| 7,034,331 B2 | * | 4/2006 | Chang et al. | 257/25 |
| 7,078,256 B2 | * | 7/2006 | Ryu et al. | 438/39 |
| 2006/0284192 A1 | | 12/2006 | Butendeich et al. | |

FOREIGN PATENT DOCUMENTS

| | | |
|---|---|---|
| EP | 01194379 | 8/1989 |
| EP | 08064869 | 3/1996 |
| EP | 11186601 | 7/1999 |
| EP | 1221723 A2 | 10/2002 |
| EP | 1221723 A3 | 10/2002 |
| EP | 2005123476 | 5/2005 |
| JP | 01-194379 | 8/1989 |
| JP | 08-64869 | 3/1996 |
| JP | 11-186601 | 7/1999 |
| JP | 2005123476 | 5/2005 |
| WO | WO 2005/004244 A2 | 1/2005 |
| WO | WO 2005/004244 A3 | 1/2005 |

OTHER PUBLICATIONS

Ga-N Based Light Emitting Diodes with Tunnel Junctions; Tetsuya Takeuchi et al., Jpn. J. Appl. Phys. vol. 40 (2001), Part 2, No. 8B, Aug. 15, 2001, pp. L861-L863.

GaN-Based Light-Emitting Diodes Using Tunnel Junctions; Seong-Ran Jeon, Mong Soo Cho, Min-A Yu and Gye Mo Yang; IEEE Journal of Selected Topics In Quantum Electronics, vol. 8, No. 4, Jul./Aug. 2002, pp. 739-743.

* cited by examiner

*Primary Examiner*—Mark Prenty

(57) ABSTRACT

A light-emitting device comprises an active region configured to generate light in response to injected charge, and an n-type material layer and a p-type material layer, wherein at least one of the n-type material layer and the p-type material layer is doped with at least two dopants, at least one of the dopants having an ionization energy higher than the ionization energy level of the other dopant.

15 Claims, 9 Drawing Sheets

US 7,473,941 B2

STRUCTURES FOR REDUCING OPERATING VOLTAGE IN A SEMICONDUCTOR DEVICE

BACKGROUND

Semiconductor-based optoelectronic devices are used in optical communication systems and other systems.

Various materials have been used to fabricate optoelectronic light emitting devices. In one example, group III and group V elements are combined in various compositions to form layers. One of the material systems that use group III and group V elements is referred to as the gallium nitride (GaN) material system. Typically, layers of group III-V elements are formed to fabricate a semiconductor optoelectronic device. These devices typically include a region referred to as a p-n junction. One or more p-n junctions may form part of a semiconductor optoelectronic device.

For optoelectronic devices formed using the GaN material system, the contact resistance of the p-type material is typically relatively high compared to the contact resistance of the n-type material. Further, the mobility of holes in the p-type material is typically lower than the mobility of electrons in the n-type material. This results in a high series resistance on the p side of a GaN device. A high series resistance elevates the operating voltage of the device and causes the generation of heat, which typically degrades the performance of the device.

One way to minimize the series resistance on the p-side of an optoelectronic device is to incorporate a tunnel junction into the device. When reverse biased, a tunnel junction promotes the flow of electrons from the p-type material to the n-type material, enabling contact to be made to n-type material, thus minimizing contact resistance. In such a device, the amount of p-type material can be minimized, thus minimizing series resistance, and lowering the operating voltage of the device. To achieve maximum benefit from a tunnel junction, the voltage drop across the tunnel junction is typically minimized.

SUMMARY OF THE INVENTION

Structures for reducing operating voltage in a semiconductor device are disclosed. Co-doping one or more tunnel junction material layers with a dopant having an ionization energy higher than the ionization energy of the other dopant reduces the operating voltage of a semiconductor device. Introducing a defect at the interface of two tunnel junction layers also reduces the operating voltage in a semiconductor device by creating a mid-gap energy state to promote tunneling. Introducing an additional material layer at the interface of two tunnel junction layers also reduces the operating voltage in a semiconductor device by creating a mid-gap energy state to promote tunneling.

BRIEF DESCRIPTION OF THE DRAWINGS

Embodiments in accordance with the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
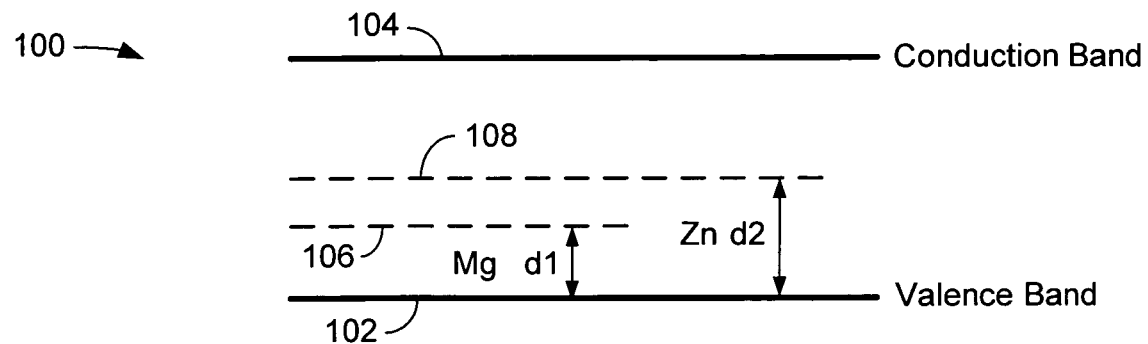
FIG. 1 is a schematic view of relative acceptor doping levels.

Embodiments in accordance with the invention are based on the realization that deep acceptor and donor level doping, while having a minimal impact in the bulk semiconductor material, significantly improves the conductivity of the semiconductor material when ionized in the depletion region of a tunnel junction or an ohmic contact. Magnesium is typically used as a p-type dopant and silicon is typically used as an n-type dopant in Group III-V nitride materials. However, additional dopants with a higher ionization energy, or activation, energy (i.e., a "deeper" impurity) will become ionized in the depletion region, appreciably reducing the width of the depletion region, and therefore reducing the operating voltage of a semiconductor device.

In an embodiment in accordance with the invention, the voltage drop of a tunnel junction is lowered by forming the tunnel junction structure of a p-type tunnel junction layer and an n-type tunnel junction layer of semiconductor materials doped to reduce the width of the depletion region between the valence band energy of the material of the p-type tunnel junction layer and the conduction band energy of the material of the n-type tunnel junction layer. Reducing the width of the depletion region decreases the energy barrier between the valence band energy of the material of the p-type tunnel junction layer and the conduction band energy of the material of the n-type tunnel junction layer and increases the tunneling probability at a given reverse bias, and, hence, reduces the voltage drop across the tunnel junction for a given current through the tunnel junction. The difference between the valence band energy of the material of the p-type tunnel junction layer and the conduction band energy of the material of the n-type tunnel junction layer is reduced by co-doping the material of the p-type tunnel junction layer with a dopant having deep acceptor levels and high ionization energy in the valence band. The co-doping of one or more layers may occur simultaneously, in which the dopants are evenly distributed throughout the material layer, or the co-doping may occur sequentially, in which a portion of a material layer is first doped with a primary dopant and a subsequent portion of a material layer is doped with a secondary, or co-dopant.

In the case of a p-type contact, co-doping the material of the p-type layer that is in contact with the metal contact material lowers the resistance between the p-type material and the metal contact, thus reducing the operating voltage of the device.

In an embodiment in accordance with the invention, the operating voltage of a semiconductor device is reduced by introducing a co-dopant to the p-type material, and/or to the n-type material. The co-dopant has a higher activation energy and an energy level that is deeper than the activation energy of the primary dopant. For p-type materials, embodiments in accordance with the invention add a dopant such as zinc (Zn), calcium (Ca), beryllium (Be), or cadmium (Cd) to the typical magnesium (Mg) dopant. For n-type material, embodiments in accordance with the invention add a dopant such as selenium (Se), tellurium (Te) oxygen, (O), sulfur (S) or tin (Sn) to the conventional silicon (Si) dopant. Dopants such as zinc, calcium, beryllium and cadmium have higher activation energy and significantly deeper acceptor levels than magnesium, and typically do not significantly affect the doping levels in the bulk material. Similarly, dopants such as selenium, tellurium, oxygen, sulfur and tin have deeper donor levels than silicon and do not affect the bulk n-type doping.

However, these secondary dopants become ionized in the depletion region occurring at a semiconductor surface or interface, thus lowering the resistance of contacts and tunnel junctions. Reducing the width of the depletion region effectively lowers the resistance of contacts and tunnel junctions. Reducing the width of the depletion region lowers the operating voltage of the device in which the material layers are co-doped with a dopant having deep acceptor and donor levels.

Embodiments in accordance with the invention also reduce the operating voltage of a semiconductor device by introducing a defect in the vicinity of a p-type material layer and an n-type material layer of a tunnel junction. The defect creates a mid-bandgap energy state that promotes tunneling to reduce the operating voltage of a semiconductor device.

Embodiments in accordance with the invention also reduce the operating voltage of a semiconductor device by introducing an additional layer between the n-type material layer and p-type material layer of a tunnel junction. The material of the additional layer has a bandgap substantially lower than the bandgap of the n-type tunnel junction layer and the p-type tunnel junction layer and promotes tunneling to reduce the operating voltage of a semiconductor device.

As used herein, the term co-doping refers to a semiconductor material layer that includes at least two dopants. The two dopants may be simultaneously applied when the material layer is formed, or the at least two dopants may be added sequentially, in which a first dopant is added to a portion of a semiconductor material layer and a second dopant is added to a subsequent portion of the semiconductor materiel layer.

An embodiment in accordance with the invention reduces the voltage drop across a tunnel junction formed having at least one layer that is co-doped with a deep acceptor level dopant. In this embodiment, a tunnel junction structure is provided in which the probability of tunneling is significantly increased at a lower voltage than otherwise obtainable by doping at least one of the tunnel junction layers with a co-dopant having a deep acceptor level. Specifically, the energy difference between the valence band of the material of the p-type tunnel junction layer and the conduction band of the n-type tunnel junction layer is reduced by adding a co-dopant, such as zinc, calcium, beryllium or cadmium to, in this example, the typical p-type dopant of magnesium. In another embodiment in accordance with the invention, the aforementioned co-doping is performed on a p-type material layer that is in contact with an ohmic contact. Doping the p-type material layer that is in contact with an ohmic contact with a co-dopant, such as zinc, calcium, beryllium or cadmium, in addition to the typical magnesium dopant, reduces the contact resistance, and therefore, the operating voltage of the device.

Another embodiment in accordance with the invention reduces the voltage drop across a tunnel junction by forming a crystal defect in the material at the tunnel junction. In another embodiment in accordance with the invention, an epitaxial metal or semi-metal layer having a bandgap substantially lower than a bandgap of the n-type tunnel junction layer and the p-type tunnel junction layer, is formed at the interface of the n-type tunnel junction layer and the p-type tunnel junction layer to promote tunneling through the tunnel junction. The defect or metallic interlayer creates a mid-bandgap state that promotes tunneling from the valence band of the material of the p-type tunnel junction layer to the conduction band of the n-type tunnel junction layer through a capture and emission process.

FIG. 1 is a schematic view of relative acceptor doping levels. For reference, the valence band is indicated at 102 and the conduction band is illustrated at 104. The acceptor level of magnesium is shown at 106 and the acceptor level of zinc is shown at 108. For ease of illustration, only the acceptor level of zinc is shown relative to the acceptor level of magnesium and the valence band. However, other dopants, such as calcium, beryllium and cadmium, have doping acceptor levels deeper than that of magnesium. Further, while p-type dopants are illustrated in FIG. 1, the donor levels of n-type dopants, such as selenium, tellurium, oxygen, sulfur and tin would be shown in reference to the conduction band 104.

With respect to the valence band of gallium nitride, the dopant ionization energy, also referred to as the activation energy or the energy level ($E_a$) of magnesium is approximately 180 milli-electronvolts (meV), illustrated as d1 in FIG. 1) and the energy level ($E_a$) of zinc is approximately 300 meV, illustrated as d2 in FIG. 1. While having a minimal effect on the doping concentration in the bulk material, the addition of zinc acceptors (or calcium, cadmium or beryllium) to the magnesium significantly improves the local conductivity of the p-n junction. The acceptor concentration in the p-type material is increased by adding the zinc, but the addition of zinc does not increase the hole concentration for bulk material. In the depletion region associated with a metal contact or a p-n junction, even deep acceptors are ionized, and their presence thereby minimizes the width of the depletion region at such junctions. This is counter-intuitive because the deep acceptor level doping does not provide benefit at electrical equilibrium for bulk materials. However, the deep acceptor co-doping may significantly reduce the width of the depletion region, despite its deep character. Stated another way, the reduction in the width of the depletion region allows a semiconductor device having one or more co-doped layers to operate at a voltage level below the voltage level of a device that does not have co-doped layers.

Figure 2:
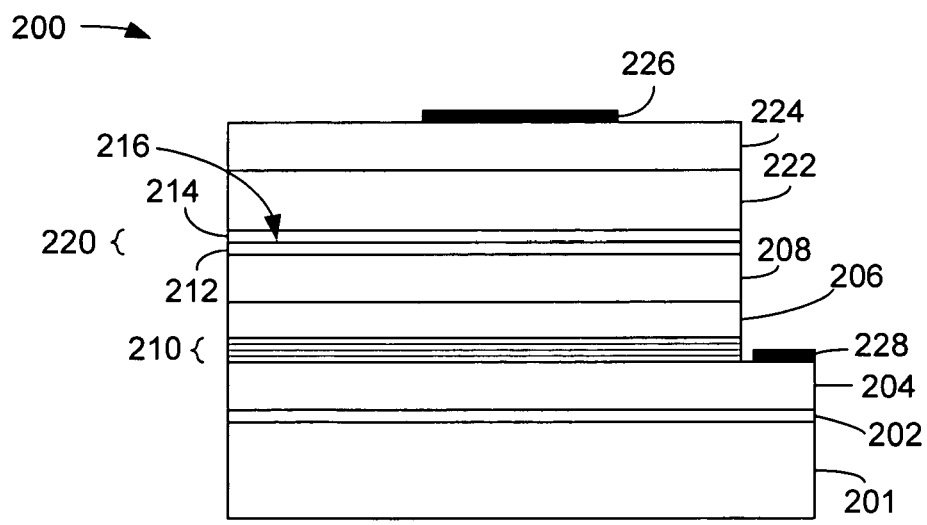
FIG. 2 is a schematic diagram of a semiconductor laser employing a tunnel junction in accordance with an embodiment of the invention.

FIG. 2 is a schematic diagram of a semiconductor light-emitting diode 200 employing a tunnel junction in accordance with an embodiment of the invention. In one embodiment, the semiconductor device 200 is formed using metal-organic chemical vapor deposition (MOCVD), also referred to as organo-metallic vapor phase epitaxy (OMVPE). Using MOCVD, chemical precursors are processed to release their constituent elements. The elements are vaporized and transported using a carrier gas to form atomic layers on a substrate. Many layers, of varying composition, are formed to create a semiconductor device. Alternatively, the layers of the semiconductor device 200 can be fabricated using molecular beam epitaxy (MBE) or other manufacturing processes.

A buffer layer 202 is formed over a sapphire substrate 201. In an embodiment in accordance with the invention, the buffer layer 202 can be formed of gallium nitride at a relatively low growth temperature of approximately 500-800 degrees C. An n-type layer 204 of gallium nitride is formed over the buffer layer 202. In an embodiment in accordance with the invention, the gallium nitride layer 204 is approximately 3 micrometers (um) thick. An active region 210 comprising alternating layers of indium gallium nitride quantum well layers and gallium nitride barrier layers is formed over the layer 204. The active region may contain one or more quantum wells, and in this example, includes 4 quantum wells.

A p-type layer 206 is formed of aluminum gallium nitride over the active region 210. The layer 206 is approximately 30 nanometers (nm) thick. A gallium nitride layer 208 is formed over the layer 206. The layer 208 is approximately 100-1000 nm thick.

A tunnel junction structure 220 comprising p-type tunnel junction layer 212 and n-type tunnel junction layer 214 is formed over the layer 208. The p-type tunnel junction layer 212 and the n-type tunnel junction layer 214 form a tunnel junction 216. In an embodiment in accordance with the invention, the p-type tunnel junction layer 212 is formed using gallium nitride or gallium indium nitride and is approximately 10 nm thick. The p-type tunnel junction layer 212 is doped using a combination of magnesium and another dopant that has an ionization energy higher than magnesium and an acceptor level deeper than that of magnesium. In this example, the p-type tunnel junction layer 212 is co-doped with magnesium and zinc. However, the p-type tunnel junction layer 212 may be co-doped with other elements, or combinations of elements including, for example, calcium and beryllium. By co-doping the p-type tunnel junction layer 212 with magnesium and zinc, a locally greater acceptor concentration will be present in the p-type tunnel junction layer 212. Consequently, as will be described below, the depletion width is reduced compared to doping with magnesium alone. When the device 200 is reverse biased, the deep doping acceptor level provided by the zinc will thereby promote tunneling from the valence band of the p-type tunnel junction layer 212 to the conduction band of the n-type tunnel junction layer 214.

Typically, dopants are added to the material layers as the material layers are formed. In an embodiment in accordance with the invention, magnesium and zinc are added to the p-type tunnel junction layer 212 when it is formed. As an example, magnesium may be added throughout the growth of the p-type tunnel junction layer 212 with zinc being added toward the end of the growth of the p-type tunnel junction layer 212, so that a heavily co-doped region is present on the surface of the p-type tunnel junction layer 212 that directly contacts the n-type tunnel junction layer 214.

The n-type tunnel junction layer 214 is formed using gallium nitride or gallium indium nitride and is approximately 10 nm thick. The n-type tunnel junction layer 214 can be conventionally doped, or can be doped using a combination of silicon and another dopant that has a donor level deeper than the donor level of silicon. If the n-type tunnel junction layer 212 is to be co-doped, the n-type tunnel junction layer 212 can be co-doped with silicon and oxygen. However, the n-type tunnel junction layer 214 may be co-doped with other elements, or combinations of elements including, for example, selenium, tellurium, sulfur and tin. Alternatively, other impurities, such as carbon or germanium may be used as co-dopants. An n-type top layer 222 is formed of gallium nitride approximately 0.5 um thick over the n-type tunnel junction layer 214. An n-type contact layer 224 is formed of gallium nitride approximately 50 nm thick over the top layer 222. An n-type contact 226 is formed on the contact layer 224 and an n-type contact 228 is formed by etching down to layer 204.

While FIG. 2 shows the tunnel junction applied in a GaN-based light emitting diode structure, an analogous tunnel junction structure may also be incorporated in group III-nitride-based laser diodes. In such an application, the identical tunnel junction layers would instead be embedded in the AlGaN upper cladding layer of the laser.

Figure 3:
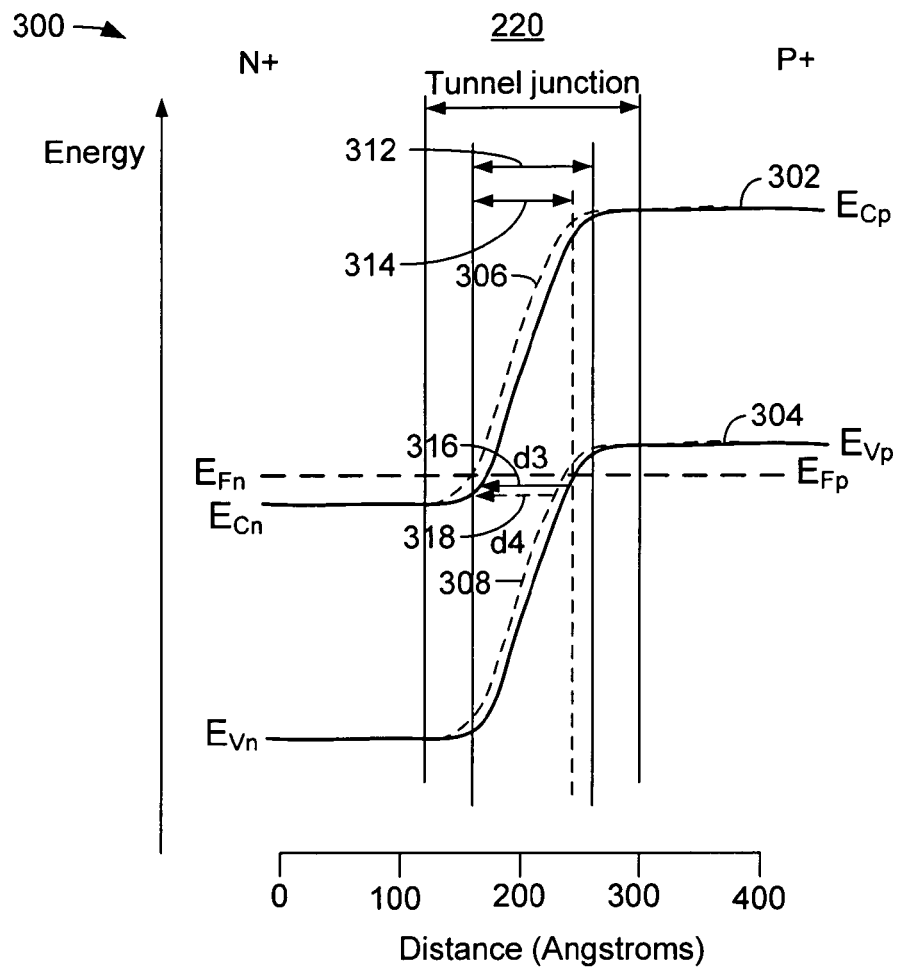
FIG. 3 is a band diagram showing the tunnel junction of FIG. 2 under a slight reverse electrical bias.

FIG. 3 is an energy band diagram 300 showing the tunnel junction of FIG. 2 under a slight reverse electrical bias. The conduction band energy is illustrated using reference numeral 302 and the valence band energy is illustrated using reference numeral 304. For this tunnel junction example, the effect of adding zinc as a p-type co-dopant to magnesium is illustrated using dotted line 306 in the conduction band and dotted line 308 in the valence band. Referring to dotted line 308 in the valence band, the addition of zinc as a co-dopant to the p-type tunnel junction layer 212 (FIG. 2) alters the band energy of the p-type tunnel junction layer 212 so that the width W of the depletion region 314 is reduced with respect to the width W of the depletion region 312 when magnesium alone is used to dope the p-type tunnel junction layer 212.

The tunneling distance between the valence band 304 of the p-type tunnel junction layer 212 and the conduction band 302 of the n-type tunnel junction layer 214 when doped using only magnesium is shown as the distance d3, and illustrated using arrow 316. When the p-type tunnel junction layer 212 is co-doped with magnesium and zinc, the tunneling distance between the valence band 304 of the p-type tunnel junction layer 212 and the conduction band 302 of the n-type tunnel junction layer 214 is reduced to distance d4, illustrated using arrow 318. Reducing the distance through which an electron must tunnel from the valence band 304 of the p-type tunnel junction layer 212 to the conduction band 302 of the n-type tunnel junction layer 214 reduces the voltage drop across the tunnel junction 220 and reduces the overall operating voltage of the semiconductor device.

Co-doping the p-type tunnel junction layer 212 and the n-type tunnel junction layer 214 thus minimizes the width of the depletion region and increases tunneling probability. This reduces the overall operating voltage of the device.

Figure 4:
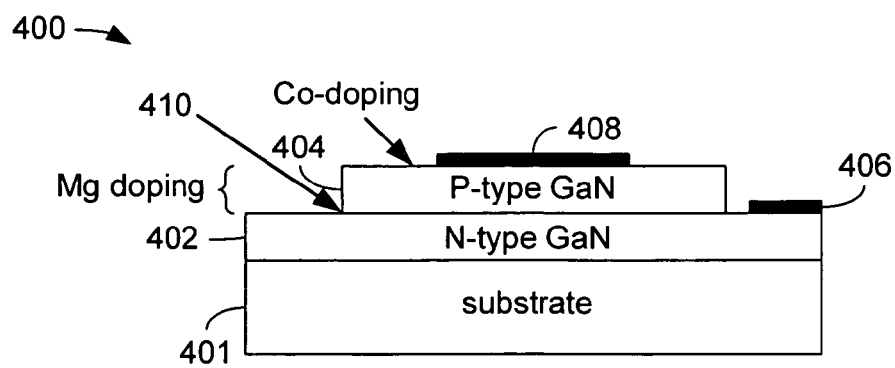
FIG. 4 is a schematic view of a semiconductor device employing a low resistance contact in accordance with another embodiment of the invention.

FIG. 4 is a schematic view of a semiconductor device 400 employing a low resistance contact in accordance with another embodiment of the invention. The semiconductor device 400 is intended to be illustrative of a variety of semiconductor devices, and as such, is shown highly simplified. The semiconductor device 400 comprises an n-type material layer 402 formed over a substrate 401. A p-type material layer 404 is formed over the n-type material layer 402, forming a p-n junction 410 therebetween. The semiconductor device 400 can be, for example, a light emitting device formed in the gallium nitride material system.

An n-type contact 406 is formed over the n-type material layer 402 and a p-type contact 408 is formed over the p-type material layer 404. As stated above, due to the high contact resistance of p-type material formed in the gallium nitride material system, and due to the low mobility of holes, it is generally desirable to minimize the amount of p-type material in a semiconductor device. However, in many instances, it is still necessary to have a p-type contact. In accordance with an embodiment of the invention, the p-type material layer 404 is co-doped using magnesium and zinc. In one embodiment, the semiconductor device 400 is formed using metal-organic chemical vapor deposition (MOCVD), also referred to as organo-metallic vapor phase epitaxy (OMVPE). Using MOCVD, chemical precursors are processed to release their constituent elements. The elements are vaporized and transported using a carrier gas to form atomic layers on a substrate. Many layers, of varying composition, are formed to create a semiconductor device. Alternatively, the semiconductor device 400 can be formed using molecular beam epitaxy (MBE) or another process.

Typically, dopants are added to the material layers as the material layers are formed. In an embodiment in accordance with the invention, magnesium and zinc are added to the p-type material layer 404 when it is formed. As an example, magnesium may be added throughout the growth of the p-type material layer 404 with zinc being added toward the end of the growth of the p-type material layer, so that a heavily co-doped region is present on the surface of the p-type material layer 404 directly under the p-type contact 408.

A heavily co-doped region of the p-type material layer 404 in contact with the p-type contact 408 significantly reduces the contact resistance between the p-type material layer 404 and the metal of the p-type contact 408. In this manner, the width of the depletion region at the junction of the p-type material layer 404 and the p-type contact 408 is smaller than if conventional doping were employed. The reduced width of the depletion region increases the tunneling probability between the p-type material layer 404 and the p-type contact 408, thus reducing the overall operating voltage of the device.

Figure 5:
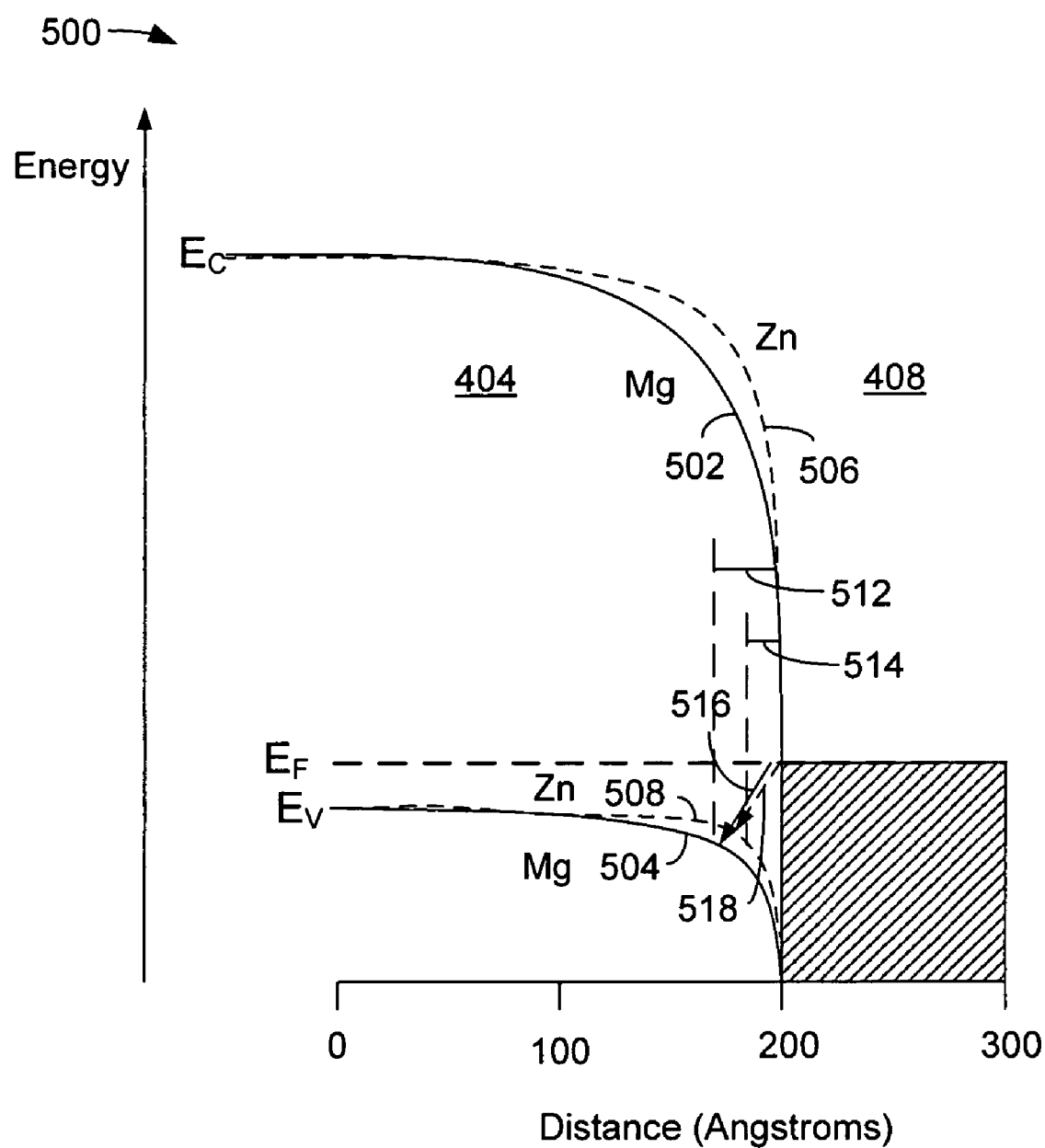
FIG. 5 is an energy band diagram of the p-type contact and the p-type material layer of the semiconductor device of FIG. 4.

FIG. 5 is an energy band diagram 500 of the p-type contact and the p-type material layer of the semiconductor device of FIG. 4. The conduction band energy is illustrated using reference numeral 502 and the valence band energy is illustrated using reference numeral 504. The p-type contact is illustrated as metal 408. For this p-type contact example, the effect of adding zinc as a p-type co-dopant to magnesium is illustrated using dotted line 506 in the conduction band and dotted line 508 in the valence band. Referring to dotted line 508 in the valence band, the addition of zinc as a co-dopant to the p-type material layer 404 alters the band energy of the p-type material layer 404 so that the width W of the depletion region is reduced with respect to the width W of the depletion region when magnesium alone is used to dope the p-type material layer 404.

The tunneling distance between the valence band 504 of the p-type material layer 404 and the conduction band 502 (i.e., the p-type contact 408) when doped using only magnesium is shown as the distance illustrated using arrow 516. When the p-type material layer 404 is co-doped with magnesium and zinc, the tunneling distance between the valence band 504 of the p-type material layer 404 and the p-type contact 408 is reduced to the distance illustrated using arrow 518. Reducing the distance through which an electron must tunnel from the valence band 504 of the p-type material layer 404 to the p-type contact 408 reduces the contact resistance, and therefore, the operating voltage of the semiconductor device. Co-doping the p-type material layer 404 thus minimizes the width of the depletion region and increases tunneling probability. This reduces the overall operating voltage of the device.

Figure 6:
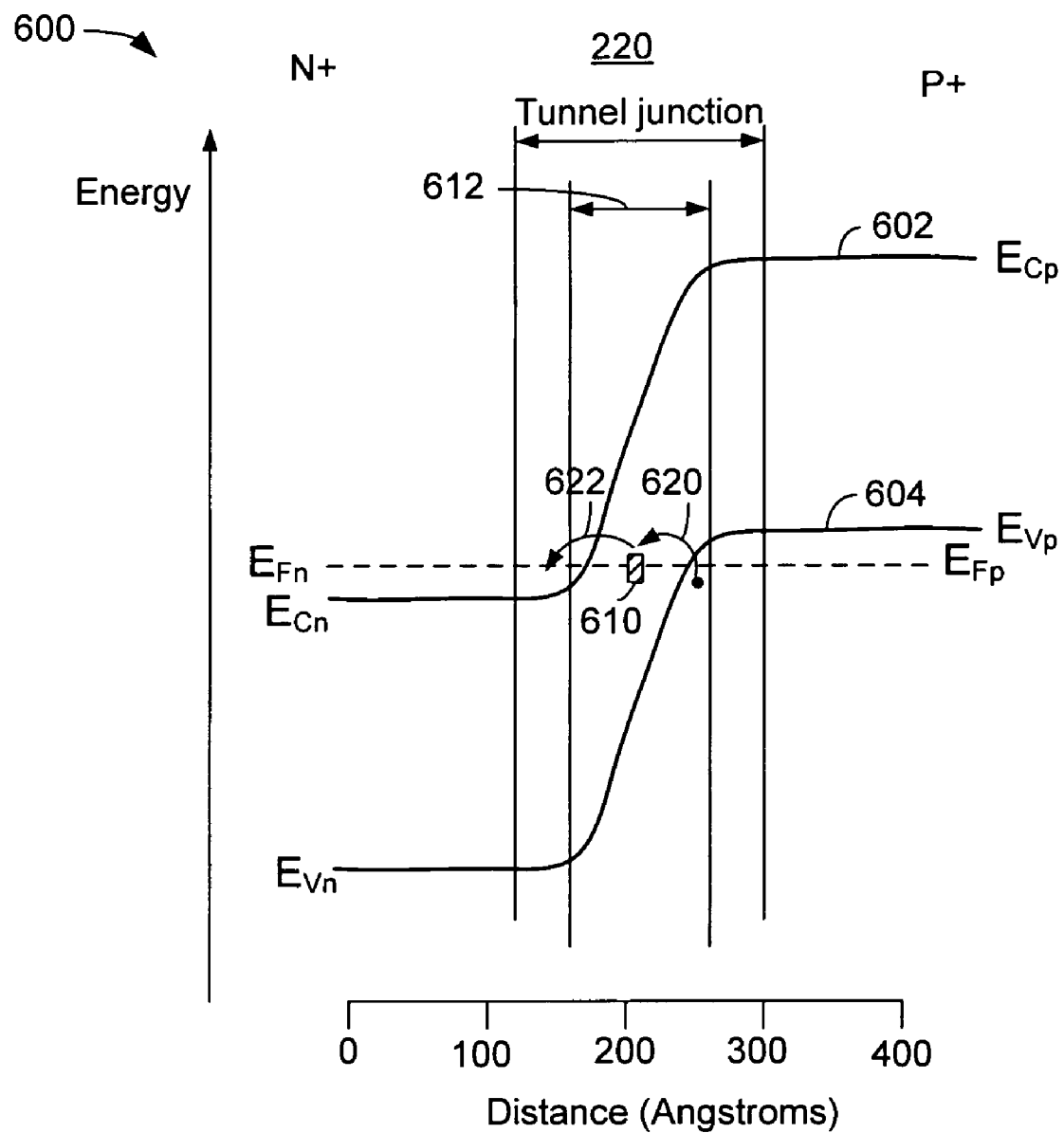
FIG. 6 is an energy band diagram showing an alternative embodiment in accordance with the invention of reducing the voltage drop across the tunnel junction of FIG. 2.

FIG. 6 is an energy band diagram 600 showing an alternative embodiment in accordance with the invention of reducing the voltage drop across the tunnel junction of FIG. 2. The conduction band energy is illustrated using reference numeral 602 and the valence band energy is illustrated using reference numeral 604. For this tunnel junction example, a defect is introduced at or near the junction of the p-type tunnel junction layer 212 and the n-type tunnel junction layer 214. The defect is illustrated in FIG. 6 at 610. The defect 610 can be, for example, a defect in the crystal lattice of the material of one or both of the p-type tunnel junction layer 212 or the n-type tunnel junction layer 214. The effect of the defect 610 is to create a mid-gap energy state to assist in tunneling between the valence band 604 of the p-type tunnel junction layer 212 and the conduction band 602 of the n-type tunnel junction layer 214. The defect 610 promotes tunneling by creating an energy state through which tunneling may occur via a capture and reemission process. The effect of creating a mid-gap energy state using a defect 610 is illustrated using lines 620 and 622 in which an electron in the valence band 604 of the p-type material tunnels to the defect site 610. The electron then tunnels from the defect site 610 to the conduction band 602 of the n-type material.

Further, the creation of a mid-gap energy state using a defect 610 can be combined with the above-described co-doping to further promote tunneling and further lower the operating voltage of a semiconductor device.

Figure 7:
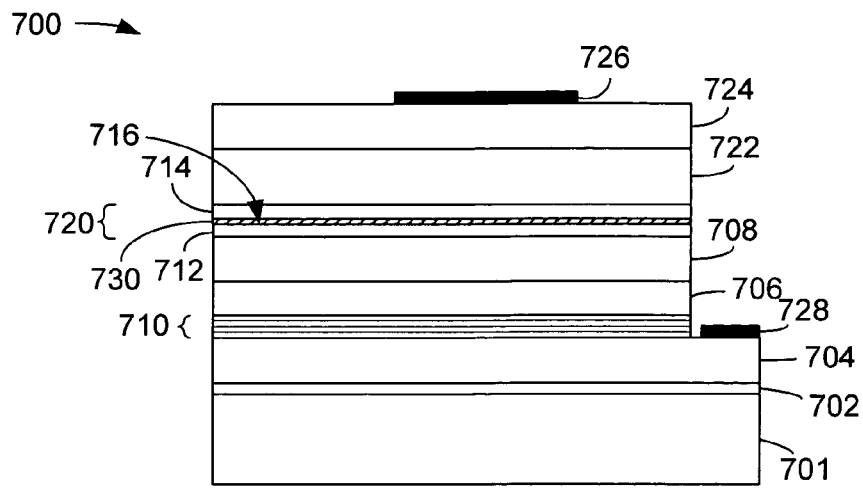
FIG. 7 is a schematic view of a semiconductor laser employing a tunnel junction in accordance with an alternative embodiment of the invention.

FIG. 7 is a schematic diagram of a semiconductor light-emitting diode 700 employing a tunnel junction in accordance with an alternative embodiment of the invention. The semiconductor device 700 can be formed in a similar manner to the semiconductor device 200.

A buffer layer 702 is formed over a sapphire substrate 701. In an embodiment in accordance with the invention, the buffer layer 702 can be formed of gallium nitride at a relatively low growth temperature of approximately 500-800 degrees C. An n-type layer 704 of gallium nitride is formed over the buffer layer 702. In an embodiment in accordance with the invention, the gallium nitride layer 704 is approximately 3 micrometers (um) thick. An active region 710 comprising alternating layers of indium gallium nitride quantum well layers and gallium nitride barrier layers is formed over the layer 704. The active region may contain one or more quantum wells, and in this example, includes 4 quantum wells.

A p-type layer 706 is formed of aluminum gallium nitride over the active region 710. The layer 706 is approximately 30 nanometers (nm) thick. A gallium nitride layer 708 is formed over the layer 706. The layer 708 is approximately 100-1000 nm thick.

A tunnel junction structure 720 comprising p-type tunnel junction layer 712, an additional layer 730 and n-type tunnel junction layer 714 is formed over the layer 708. The p-type tunnel junction layer 712 and the n-type tunnel junction layer 714 form a tunnel junction 716. In this embodiment in accordance with the invention, the additional layer 730, also referred to as an interlayer, is a metal material or a semi-metal material and is formed to a thickness of approximately 1 nm. The additional layer 730 has a bandgap that is substantially lower than the bandgap of the p-type tunnel junction layer 712 and the n-type tunnel junction layer 714 and is preferably compatible with gallium nitride. Examples of materials suitable for the additional layer 730 include, but are not limited to, indium nitride (InN), indium arsenide (InAs) and indium antimonide (InSb). In addition, a semi-metal material comprising a rare-earth group V material, such as erbium arsenide (ErAs), or another rare-earth arsenide, phosphide, antimonide, or nitride may also be suitable.

In this embodiment, the p-type tunnel junction layer 712 is formed using gallium nitride or gallium indium nitride and is approximately 10 nm thick. The p-type tunnel junction layer 712 can be doped using only magnesium, or can be doped using a combination of magnesium and another dopant that has an ionization energy and an acceptor level deeper than that of magnesium. In this example, the p-type tunnel junction layer 712 is doped with magnesium. However, the p-type tunnel junction layer 712 may be co-doped with other elements, or combinations of elements including, for example, zinc, calcium, beryllium and cadmium. The additional material layer 730 creates a mid-gap energy state and promotes tunneling from the valence band of the p-type material to the conduction band of the n-type material when the device 700 is reverse biased. The additional layer 730 may have a bandgap of approximately of 0.9 eV if formed using indium nitride and a bandgap of approximately 0.1-0.2 eV if formed using erbium arsenide. The p-type tunnel junction layer 712 and the n-type tunnel junction layer 714 may have a bandgap on the order of 3.4 eV if formed using gallium nitride. Depending on material composition, the additional material layer 730 may have a bandgap between approximately 0.9 eV and 3.4 eV. The lower bandgap of the additional layer 730, compared to the bandgap of the tunnel junction layers 712 and 714, creates a mid-gap energy state and promotes tunneling from the valence band of the p-type material to the conduction band of the n-type material when the device 700 is reverse biased.

The n-type tunnel junction layer 714 is formed using gallium nitride or gallium indium nitride and is approximately 10 nm thick. The n-type tunnel junction layer 714 can be conventionally doped, or can be doped using a combination of silicon and another dopant that has a donor level deeper than that of silicon. If the n-type tunnel junction layer 712 is to be co-doped, the n-type tunnel junction layer 712 can be co-doped with silicon and oxygen. However, the n-type tunnel junction layer 714 may be co-doped with other elements, or combinations of elements including, for example, selenium, tellurium, sulfur and tin, as described above. An n-type top layer 722 is formed of gallium nitride approximately 0.5 um thick over the n-type tunnel junction layer 714. An n-type contact layer 724 is formed of gallium nitride approximately 50 nm thick over the top layer 722. An n-type contact 726 is formed on the contact layer 724 and an n-type contact 728 is formed by etching down to layer 704.

While FIG. 7 shows the tunnel junction applied in a GaN-based light emitting diode structure, an analogous tunnel junction structure may also be incorporated in group III-nitride-based laser diodes. In such an application, the identical tunnel junction layers would instead be embedded in the AlGaN upper cladding layer of the laser.

Figure 8:
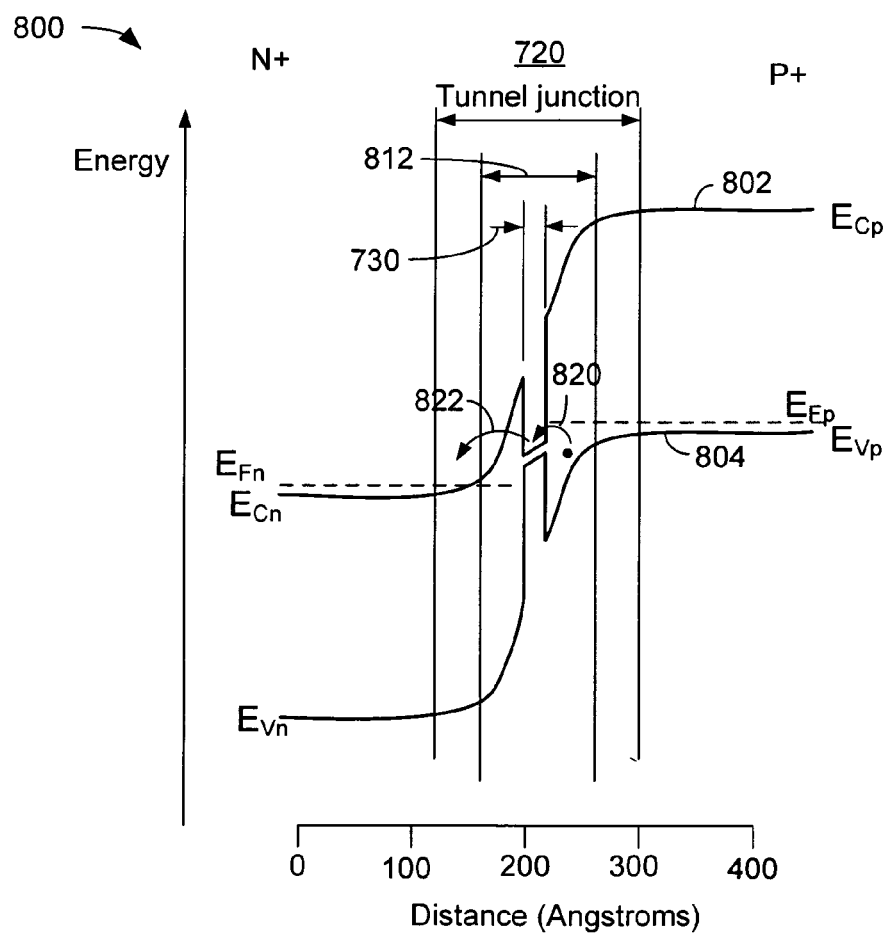
FIG. 8 is an energy band diagram showing the voltage drop across the tunnel junction of FIG. 7.

FIG. 8 is an energy band diagram showing the voltage drop across the tunnel junction of FIG. 7. The conduction band energy is illustrated using reference numeral 802 and the valence band energy is illustrated using reference numeral 804. For this tunnel junction example, an additional material layer 730, or interlayer, having a bandgap smaller than the bandgap of the p-type tunnel junction layer 712 and the n-type tunnel junction layer 714, creates a mid-gap energy state to promote tunneling between the valence band 804 of the p-type tunnel junction layer 712 and the conduction band 802 of the n-type tunnel junction layer 714. The additional layer 730 promotes tunneling by creating an energy state through which tunneling may occur via a two-step tunneling process. The effect of creating a mid-gap energy state using an additional layer 730 is illustrated using lines 820 and 822 in which an electron in the valence band 804 of the p-type material tunnels to the additional layer 730. The electron then tunnels from the additional layer 730 to the conduction band 802 in then-type material.

Further, the creation of a mid-gap energy state using an additional layer 730 can be combined with the above-described co-doping to further promote tunneling and lower the operating voltage of a semiconductor device.

Figure 9:
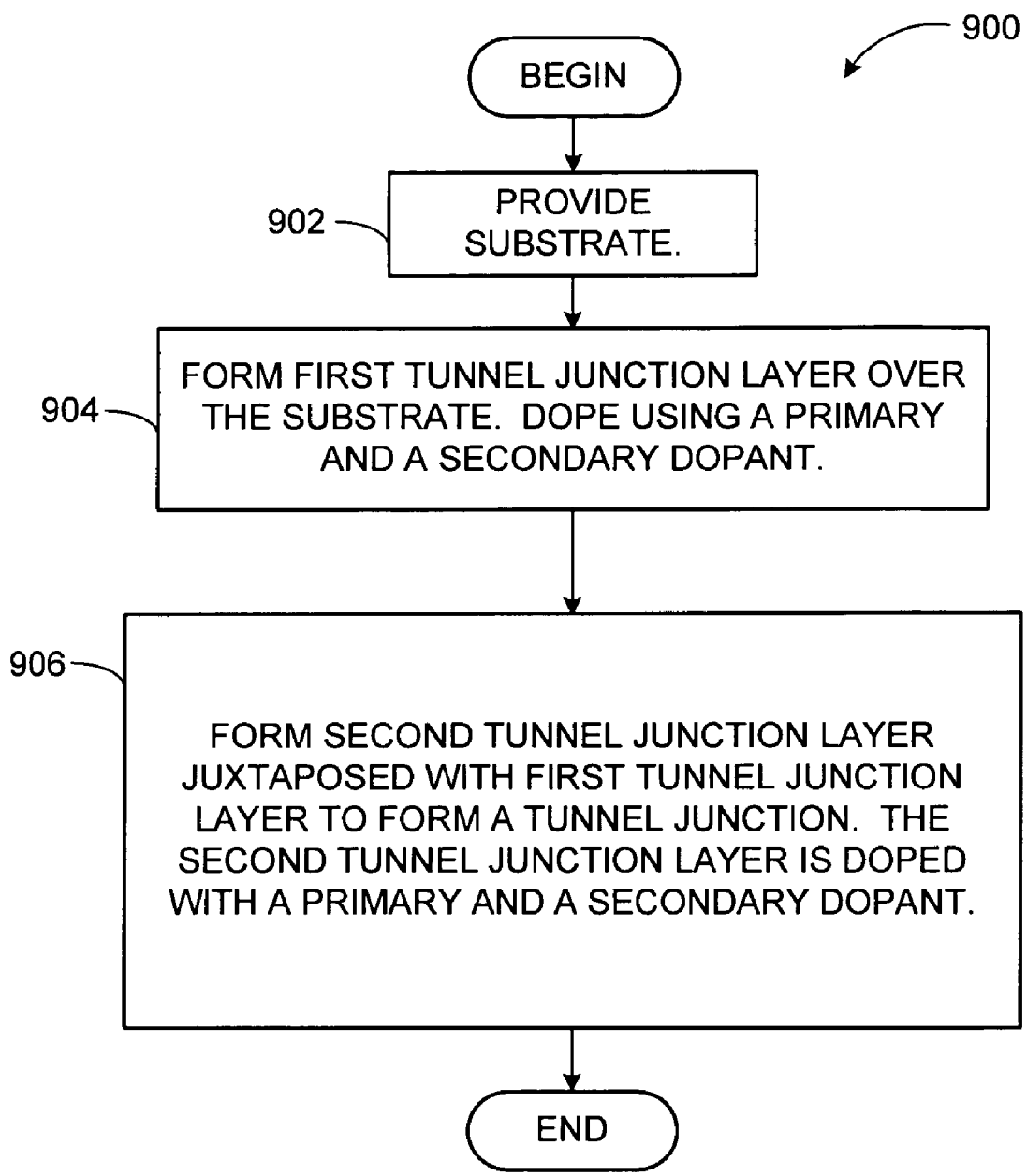
FIG. 9 illustrates a method according to an embodiment of the invention for making a tunnel junction structure that reduces the operating voltage in a semiconductor device.

FIG. 9 illustrates a method 900 according to an embodiment of the invention for making a tunnel junction structure that reduces the operating voltage in a semiconductor device. In block 902 a substrate is provided. In block 904, a p-type tunnel junction layer of a first semiconductor material is formed over the substrate. This can be accomplished by depositing a layer of the first semiconductor material over or on the substrate. The layer of the first semiconductor material is doped with a primary and a secondary dopant. The primary dopant can be, for example, magnesium, and the secondary, or co-dopant, can be, for example, a material having a higher dopant ionization energy and a deeper acceptor level than magnesium. In this example, the co-dopant can be chosen from zinc (Zn), calcium (Ca), cadmium, (Cd) and beryllium (Be). The dopant is supplied at the time that the layer is grown. When fabricated using MOCVD, gaseous or molecular compounds, such as Diethyl- or dimethyl-zinc, dimethylcadmium, and diethylberyllium. When fabricated using molecular beam epitaxy (MBE), solid elemental materials are evaporated from elemental sources for use as dopants.

The primary and secondary dopants can be simultaneously added to the semiconductor material layer when it is grown, resulting in a uniform, distribution of dopant throughout the layer. Alternatively, the primary and secondary dopants can be added sequentially so that a first portion of a semiconductor material layer is doped with the primary dopant and a second portion of the semiconductor material layer is doped with the secondary dopant. Alternatively, the primary and secondary dopants can be added to the semiconductor material layer in various proportions throughout the thickness of the layer.

In block 906, an n-type tunnel junction layer of a second semiconductor material is formed juxtaposed to the p-type tunnel junction layer. The n-type tunnel junction layer and the p-type tunnel junction layer collectively form a tunnel junction. Either or both of the first semiconductor material and the second semiconductor material include a primary dopant and a secondary dopant. The second semiconductor material of the n-type tunnel junction layer may be doped with a primary dopant, such as silicon (Si) and a secondary, or co-dopant, having a higher dopant ionization energy and a deeper donor level than the primary dopant. In this example, the co-dopant can be chosen from selenium (Se), tellurium (Te) sulfur (S), tin (Sn) and oxygen (O). The dopant is supplied at the time that the layer is grown. When fabricated using MOCVD, gaseous or molecular compounds, such as hydrogen selenide ($H_2Se$), diethyl- or dimethyltelluride, hydrogen sulfide ($H_2S$), tetraethyltin, oxygen ($O_2$) or water are used as precursors. When fabricated using molecular beam epitaxy (MBE), solid or gaseous elemental materials are used as for the primary and secondary dopants.

Either the p-type tunnel junction layer or the n-type tunnel junction layer can be grown lattice-matched or pseudomorphically or otherwise applied to the juxtaposed layer. Layers of additional materials may be grown or otherwise applied upon the tunnel junction layer remote from the substrate.

Figure 10:
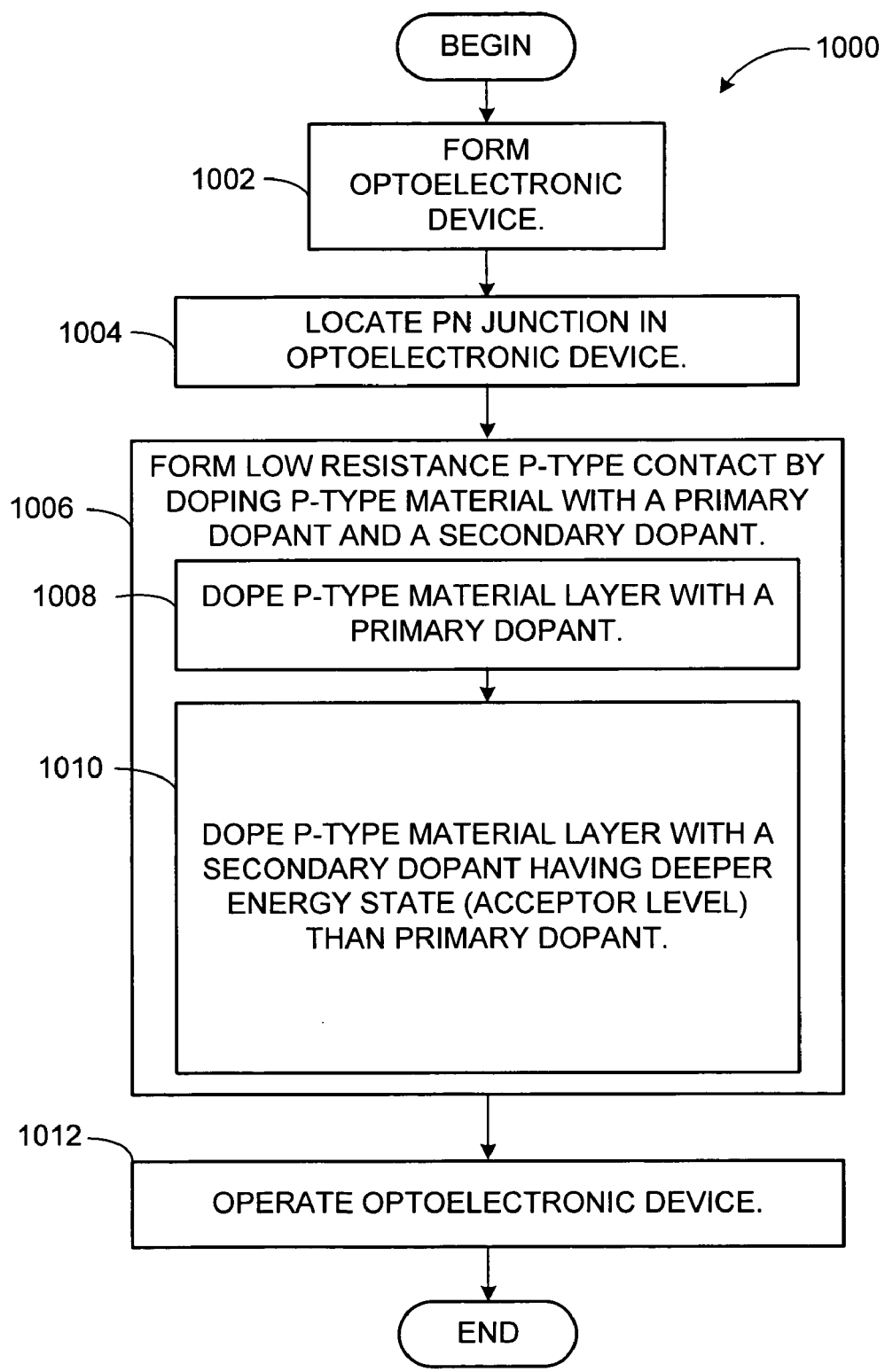
FIG. 10 illustrates a method according to an embodiment of the invention for forming a low resistance contact that reduces the operating voltage in a semiconductor device.

FIG. 10 illustrates a method 1000 according to an embodiment of the invention for forming a low resistance contact that reduces the operating voltage in a semiconductor device. In block 1002, an optoelectronic device is formed. In block 1004, a p-n junction is located in the optoelectronic device. In block 1006, a low-resistance p-type contact is formed by doping the p-type material with a primary dopant and a secondary, or co-dopant. The co-dopant has a higher dopant ionization energy and therefore a deeper acceptor level than the primary dopant. Block 1006 includes blocks 1008 and 1010. In block 1008, the p-type material is doped with a primary dopant, such as magnesium. In block 1010, the p-type material is doped with a secondary dopant, chosen from zinc, calcium, beryllium and cadmium. The secondary dopant has a higher dopant ionization energy and a deeper acceptor level than the primary dopant. In block 1012, voltage is applied to the optoelectronic device and the optoelectronic device is operated.

Figure 11:
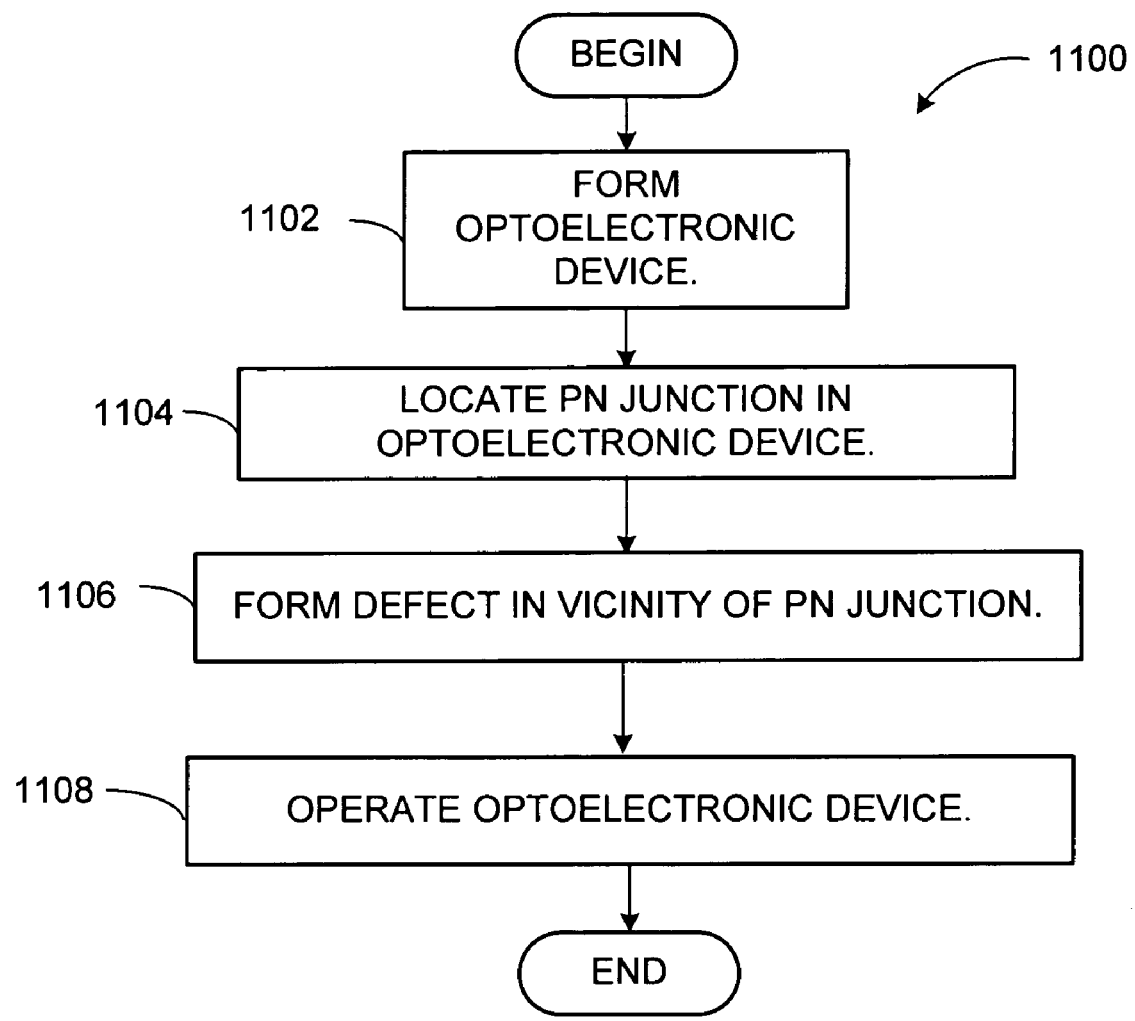
FIG. 11 illustrates an alternative method according to an embodiment of the invention for reducing operating voltage in a semiconductor device.

FIG. 11 illustrates an alternative method 1100 according to an embodiment of the invention for reducing operating voltage in a semiconductor device. In block 1102, an optoelectronic device is formed. In block 1104, a p-n junction is located in the optoelectronic device. In block 1106, a defect is formed in the vicinity of the p-n junction. The defect can be formed by, for example, altering the growth parameters when forming the layers of the optoelectronic device in the vicinity of the p-n junction, or doping the layers of the p-n junction with an impurity that creates a mid-gap energy state. The defect creates a mid-gap energy state in the vicinity of the p-n junction. The mid-gap energy state provides a path for a carrier to tunnel from the p-type material of the valence band to the n-type material of the conduction band by, for example, capture and reemission. The tunneling path increases the probability that tunneling will occur, and therefore lowers the operating voltage of the optoelectronic device. In block 1108, voltage is applied to the optoelectronic device and the optoelectronic device is operated.

Figure 12:
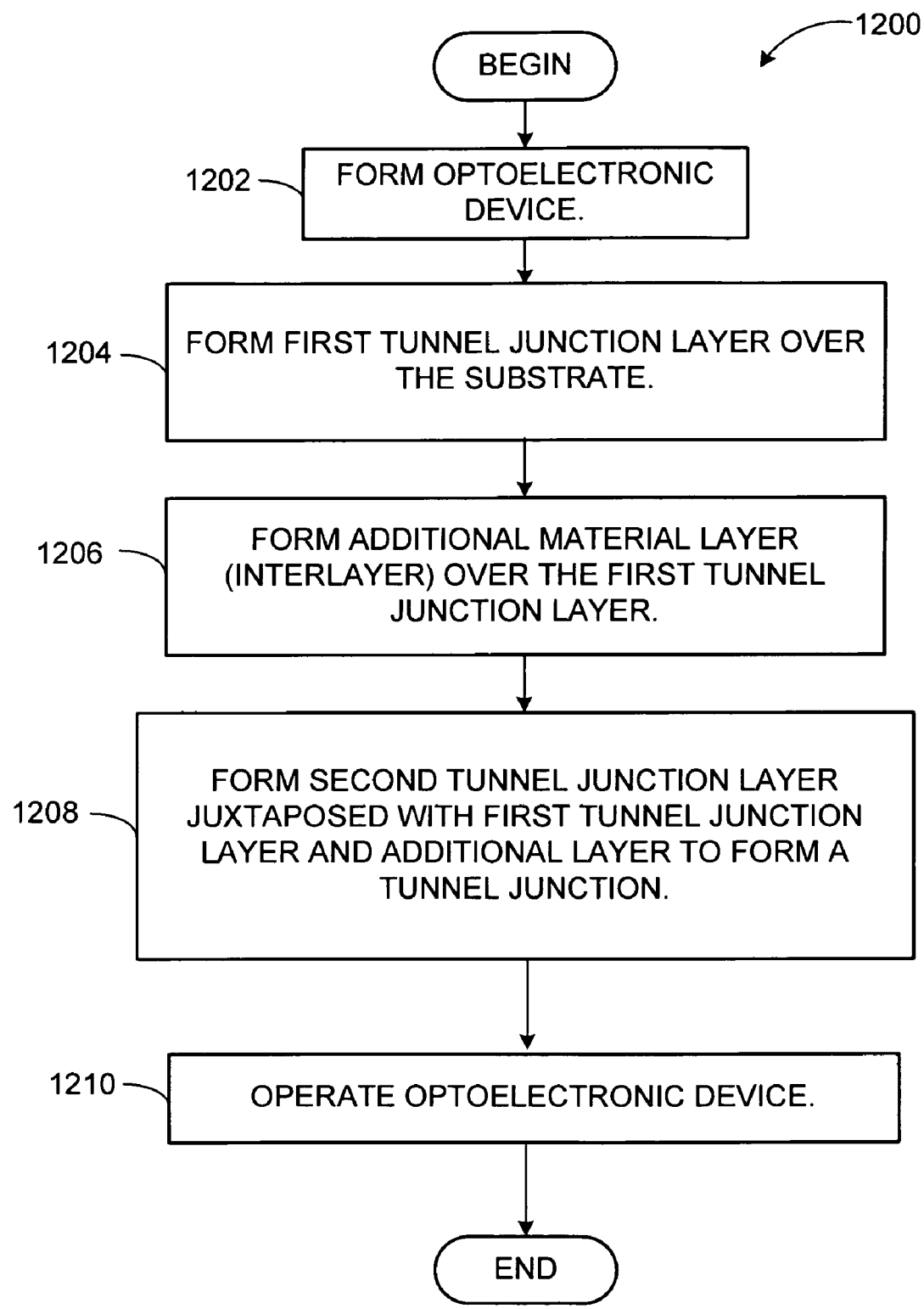
FIG. 12 illustrates an alternative method according to an embodiment of the invention for reducing operating voltage in a semiconductor device.

FIG. 12 illustrates an alternative method according to an embodiment of the invention for reducing operating voltage in a semiconductor device. In block 1202, an optoelectronic device is formed. In block 1204, a p-type tunnel junction layer of a first semiconductor material is formed over the substrate. This can be accomplished by depositing a layer of the first semiconductor material over or on the substrate. In block 1206, an additional layer is formed over the first tunnel junction layer. The additional material layer has a bandgap substantially smaller than a bandgap of the first tunnel junction layer and a subsequently formed second tunnel junction layer. In block 1208 a second tunnel junction layer is formed over the additional layer. The additional layer creates a mid-gap energy state in the vicinity of the p-n junction. The mid-gap energy state provides a path for a carrier to tunnel from the p-type material of the valence band to the n-type material of the conduction band by, for example, capture and reemission. The tunneling path increases the probability that tunneling will occur, and therefore lowers the operating voltage of an optoelectronic device in which the tunnel junction is located. In block 1210, voltage is applied to the optoelectronic device and the optoelectronic device is operated.

This disclosure describes the invention in detail using illustrative embodiments in accordance with the invention. However, it is to be understood that the invention defined by the appended claims is not limited to the precise embodiments described.

What is claimed is:

1. A light-emitting device, comprising:
    an active region configured to generate light in response to injected charge; and
    an n-type material layer and a p-type material layer comprising a tunnel junction structure located to inject charge into the active region and including an n-type tunnel junction layer of a first semiconductor material, a p-type tunnel junction layer of a second semiconductor material and a tunnel junction between the tunnel junction layers, the p-type tunnel junction layer being doped with at least two p-type dopants, at least one of the p-type dopants having an ionization energy higher than the ionization energy of the other p-type dopant.

2. The light-emitting device of claim 1, in which an n-type dopant is chosen from silicon (Si), selenium (Se), tellurium (Te), oxygen (O), sulfur (S) and tin (Sn).

3. The light-emitting device of claim 1, in which a p-type dopant is chosen from magnesium (Mg), zinc (Zn), calcium (Ca), beryllium (Be) and cadmium (Cd).

4. The light-emitting device of claim 1, in which the at least two p-type dopants minimize a width of a depletion region formed at an interface of the n-type tunnel junction layer and the p-type tunnel junction layer.

5. The light-emitting device of claim 1, in which the at least two p-type dopants are evenly distributed throughout the p-type material layer.

6. The light-emitting device of claim 1, in which the at least two p-type dopants are sequentially distributed in the p-type material layer.

7. A light emitting device, comprising:
    an active region configured to generate light;
    an n-type tunnel junction layer;
    a p-type tunnel junction layer; and
    a tunnel junction between the tunnel junction layers, wherein an intentionally created defect in at least one of the n-type tunnel junction layer and the p-type tunnel junction layer in a vicinity of the tunnel junction creates a mid-bandgap energy state between a valence band in the p-type tunnel junction layer and the conduction band in the n-type tunnel junction layer.

8. The light emitting device of claim 7, in which the defect promotes tunneling from a valence band of the p-type tunnel junction layer to a conduction band of the n-type tunnel junction layer.

9. A light emitting device, comprising:
    an active region configured to generate light;
    an n-type tunnel junction layer;
    a p-type tunnel junction layer;
    a tunnel junction between the tunnel junction layers; and
    an additional layer between the n-type tunnel junction layer and the p-type tunnel junction layer, wherein the additional layer has a bandgap substantially lower than a bandgap of the n-type tunnel junction layer and the p-type tunnel junction layer, in which the additional layer promotes tunneling from a valence band of the p-type tunnel junction layer to a conduction band of the n-type tunnel junction layer and in which the additional layer is chosen from a metal material and a semimetal material.

10. The light-emitting device of claim 9, in which the n-type tunnel junction layer is doped with a dopant chosen from silicon (Si), selenium (Se), tellurium (Te), oxygen (O), sulfur (S) and tin (Sn).

11. The light-emitting device of claim 9, in which the p-type tunnel junction layer is doped with a dopant is chosen from magnesium (Mg), zinc (Zn), calcium (Ca), beryllium (Be) and cadmium (Cd).

12. The light-emitting device of claim 9, further comprising a tunnel junction structure located to inject charge into the active region and wherein, at least one of the tunnel junction layers is doped with at least two dopants, at least one of the dopants having an ionization energy higher than the ionization energy of the other dopant.

13. The light-emitting device of claim 12, in which the at least two dopants minimize a width of a depletion region formed at an interface of the n-type tunnel junction layer and the additional layer, and at an interface of the p-type tunnel junction layer and the additional layer.

14. A light-emitting device, comprising:
    an n-type material layer formed over a substrate;

a p-type material layer formed over the n-type material layer, the p-type material layer and the n-type material layer forming a p-n junction therebetween;

an n-type contact formed over the n-type material layer;

a p-type contact formed over the p-type material layer, wherein the p-type material layer is co-doped using magnesium and zinc, wherein the magnesium is located throughout the p-type material layer and wherein the zinc is located near a surface of the p-type material layer, resulting in a heavily co-doped region of the p-type material layer located directly under the p-type contact.

15. The light-emitting device of claim 14, in which the magnesium and zinc minimize a width of a depletion region formed at an interface of the p-type material layer and the p-type contact.

* * * * *